United States Patent [19]
Farrall

[11] Patent Number: 4,939,401
[45] Date of Patent: Jul. 3, 1990

[54] METHOD AND SYSTEM FOR ACTIVATION OF A PIEZOELECTRIC BENDER SWITCH

[75] Inventor: George A. Farrall, Rexford, N.Y.

[73] Assignee: General Electric Company, Schenectady, N.Y.

[21] Appl. No.: 380,570

[22] Filed: Jul. 17, 1989

[51] Int. Cl.⁵ ............................................. H01L 41/08
[52] U.S. Cl. ..................................... 310/317; 310/311; 310/330; 310/332; 29/25.35
[58] Field of Search ........ 310/316, 317, 311, 330–332; 318/116, 118; 29/25.35

[56] References Cited
U.S. PATENT DOCUMENTS

| | | | |
|---|---|---|---|
| 4,654,553 | 3/1987 | Sato | 310/316 |
| 4,658,154 | 4/1987 | Harnden, Jr. et al. | 310/317 X |
| 4,663,555 | 5/1987 | Yoshihiro | 310/316 X |

*Primary Examiner*—Mark O. Budd
*Attorney, Agent, or Firm*—John S. Beulick; James C. Davis, Jr.; Paul R. Webb, II

[57] ABSTRACT

A method and system, which minimize contact bounce during closure of a piezoelectric bender switch, control the switch closure to occur when the movable contact is traveling at a low velocity, when the phase of oscillation of the movable contact tends to press the contacts together after closure, and when the magnitude of the closing force developed in the first piezoelectric layer is only a fraction of its maximum value.

13 Claims, 2 Drawing Sheets

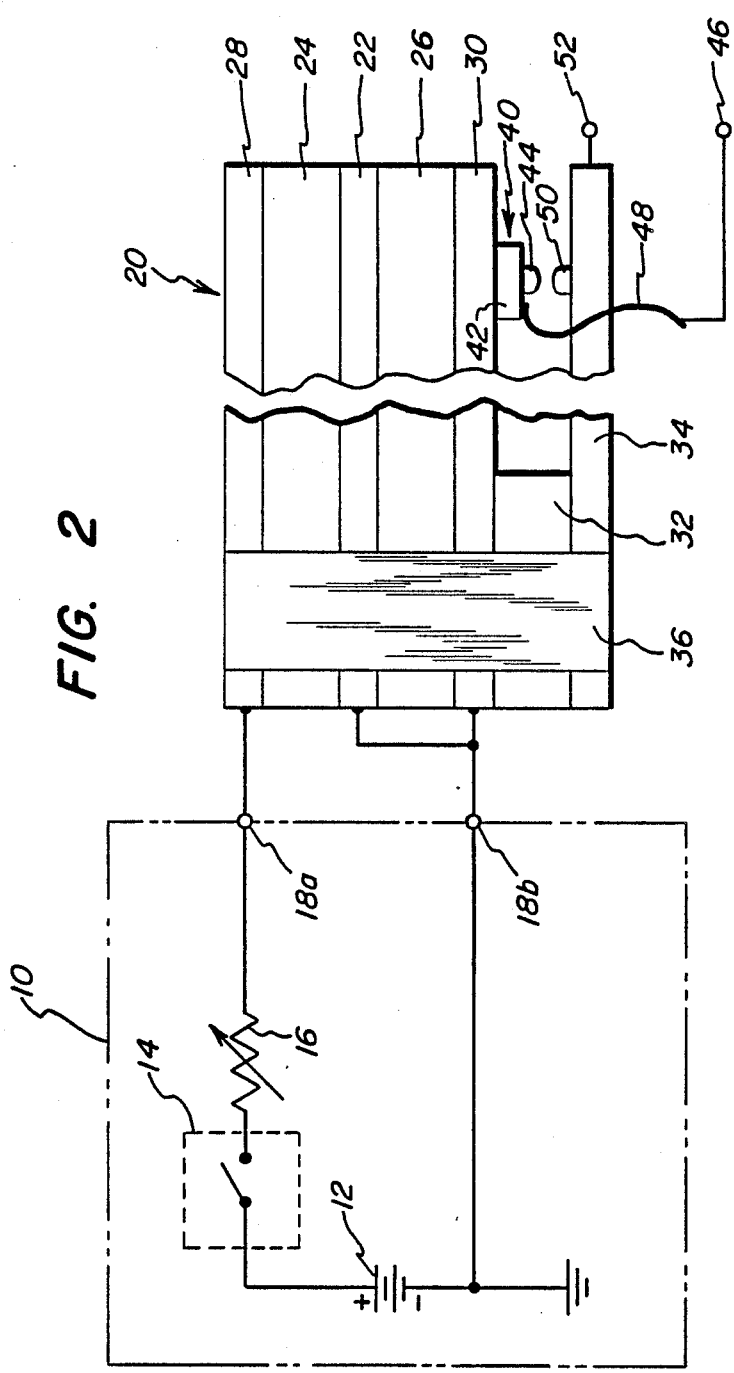

METHOD AND SYSTEM FOR ACTIVATION OF A PIEZOELECTRIC BENDER SWITCH

The present invention relates in general to switches and more specifically to a method ans system for controlling the activation of a piezoelectric bender switch so as to minimize contact bounce.

BACKGROUND OF THE INVENTION

In almost all known switch devices having a movable and a stationary contact, the movable contact bounces off the stationary contact upon closure. In piezoelectric bender switches such contact bounce is particularly undesirable for many reasons, including the fact that arcing may occur between the stationary and movable contacts, thereby eroding contact surfaces and effecting the integrity of the switch. In some instances, arcing may cause the stationary and movable contacts to become welded together, thus terminating the useful life of the switching device.

A piezoelectric bender switch generally includes a central metal foil sandwiched between first and second thin layers of piezoelectric ceramic, which in turn are sandwiched between a pair of first and second electrically conductive metal layers. These layers form a beam, which may typically be about one inch in length and one half inch or less in width. One end of the beam is affixed to a support while the free end of the beam carries a contact, referred to herein as a movable contact, wich is mounted on and extends from the first metal layer. The movable contact is insulated from the beam, and a separate stationary contact is disposed on a fixed surface opposite and spaced from the movable contact.

In one mode of operation, a DC voltage, referred to herein as a charging voltage, is applied between the first electrically conductive metal layer and the metal foil. The metal foil and the second metal layer are connected to ground. The charging voltage produces a dimensional change in the first piezoelectric layer, while the second piezoelectric layer and the central foil do not change dimensionally. The dimensional change in the first layer causes a warping of the beam, much like the action of bimetallic strip exposed to a temperature change. The dimensional change in the beam, however, is brought about by the application of a voltage rather than by a change in temperature. The dimensional change brought about by voltage is much more rapid than the dimensional change of a bimetallic strip brought about by temperature.

With relative rapid excitation, the bending or warping motion of the beam is not unidirectional. Rather, the beam oscillates as it carries the movable contact towards the fixed contact. When the charging voltage applied to the first piezoelectrid layer becomes sufficiently large, the resulting displacement of the free end of the beam causes the movable contact to strike the fixed contact. The movable contact, at this time, may be moving at a significant velocity on the order of 10 cm/sec. At contact closure, it is essential that a voltage be applied which is greater than the minimum required voltage to bring the contacts together. A voltage greater than the minimum voltage assures that the contacts will be held together with sufficient force to maintain a good electrical connection.

With known systems, contact bounce occurs when the movable contact, moving at a high velocity, impacts upon the stationary contact. In this condition, the beam oscillations tend to further increase the duration and magnitude of the contact bounce. Specifically, the phase of oscillation of the movable contact may be such that at contact closure, the movable contact may begin moving away from the fixed contact. Also, with systems of this kind, it is common to arbitrarily select the charging voltage to have a fixed magnitude which typically is two or three times the voltage required to bring the contacts together. This arbitrarily chosen charging voltage may cause contact closure at excessive velocity which tends to increase contact bounce still further.

Known systems for suppresing contact bounce include a spring-mounted mass located between the stationary contact and the surface to which the stationary contact is mounted. When the movable contact carried on the free end of the flexible beam impacts upon the stationary contact, the spring absorbs some of the impact. The use of a spring-mounted mass system to reduce contact bounce adds to the cost of manufacturing and constructing switches. Further, such a technique does not necessarily minimize contact bounce. In some cases, the spring-mounted mass, if not properly adjusted, may even exacerbate the contact bounce.

OBJECTS OF THE INVENTION

It is therefore an object of the present invention to provide a system and method for controlling the activation of piezoelectric bender switches which overcome the foregoing shortcomings and disadvantages of known switch devices.

Another object of the present invention is to provide a system and method for controlling the activation of piezoelectric bender switches wherein contact bounce between a movable contact and a stationary contact is minimized.

Still another object of the present invention is to provide a system and method for controlling the activation of piezoelectric bender switches wherein deterioration of contact surfaces and contact welding are minimized.

SUMMARY OF THE INVENTION

In accordance with the present invention, contact bounce is suppressed by the selection of a charging voltage and other parameters. The selected charging voltage is applied to a piezoelectric bender switch so that between the movable and stationary contact occurs when: (1) the movable contact is traveling at a low velocity; (2) the phase of oscillation of the movable contact tends to press the contacts together after closure; and (3) the closure occurs at an instant when the magnitude of the closing force developed in the first piezoelectric layer is only a fraction of its maximum value. By applying the charging voltage which controls the deflection of each beam in this manner, the present switch control system and method tend to suppress contact bounce and minimize arcing between the fixed and movable contacts.

BRIEF DESCRIPTION OF THE DRAWINGS

These and other objects of the present invention, together with further features and advantages thereof, will be apparent from the following detailed specification when read together with the accompanying drawings in which:

FIG. 2 is a schematic diagram of the activation control system and the piezoelectric bender switch illustrated in FIG. 1.

DETAILED DESCRIPTION OF THE DRAWINGS

Figure 1:
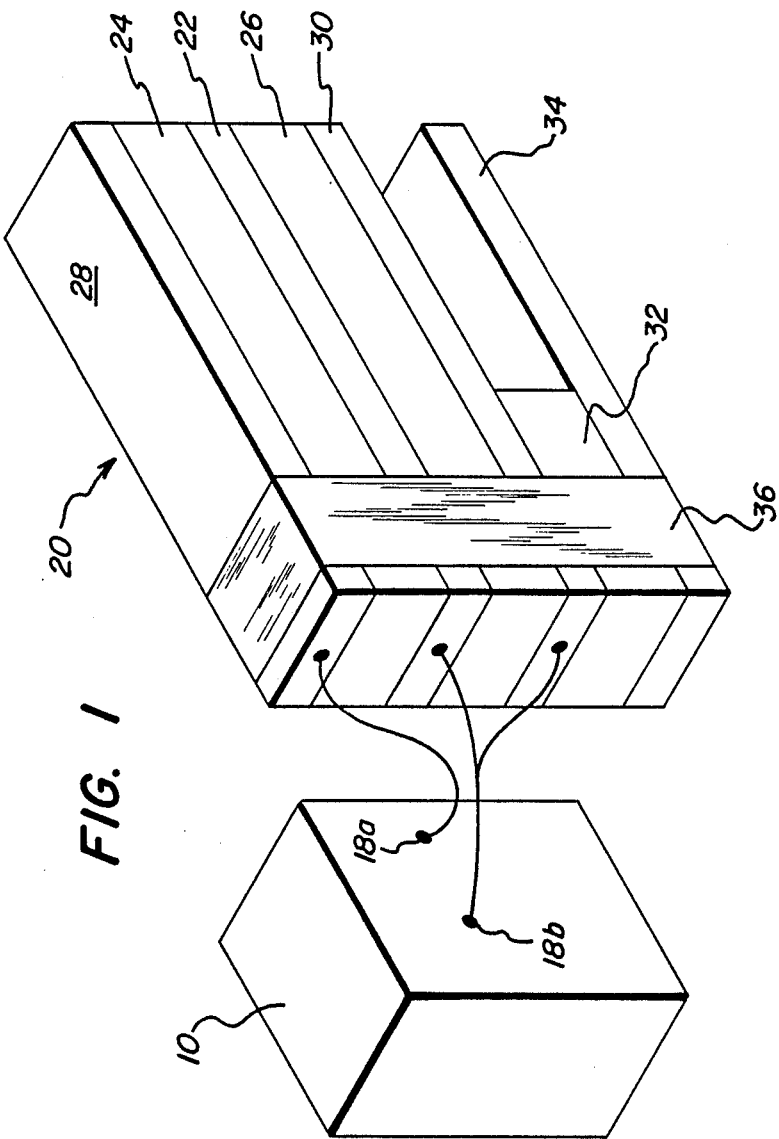
FIG. 1 is a perspective view of a piezoelectric bender switch and control system.

FIG. 1 illustrates a bender switch activation unit 10 connected to a piezoelectric bender switch 20. Unit 10 and switch 20 are known in the art, and many variations and substitute constructions are possible and contemplated. As illustrated in FIG. 2, unit 10 includes a variable DC voltage source 12, a switch 14, and a variable resistor 16 connected in series. Switch 14 is preferably capable of being operator-controlled and may, for example, be a relay or other mechanical/electrical switching device. Activation unit 10 further includes first and second output terminals 18a and 18b.

Bender switch 20, as shown in FIGS. 1 and 2, includes a central metal foil 22 disposed between first and second piezoelectric layers 24 and 26, respectively. Conducting layers 28 and 30 are disposed on the outer surfaces of piezoelectric layers 24 and 26, respectively. The foil and piezoelectric layers generally are adhesively attached together, and the conducting layers are preferably vapor deposited on the piezoelectric layers, to form a beam. First metal layer 28 is connected to first output terminal 18a, and second metal layer 30 and foil 22 are connected in common to second terminal 18b.

A spacing member 32 is positioned between second layer 30 and a base member 34. A support, shown as a clamp 36 at one end of the beam, is utilized to maintain the elements of switch 20 in proper position. The opposite end of the beam is free to move. Mounted adjacent the free end of second metal layer 30 is a movable contact 40, visible in FIG. 2, which includes an insulation layer 42 and a first contact portion 44. An electrical connection is provided between first contact portion 44 and a first switch terminal 46 by means of a lead which extends through a flexible braid 48. Positioned opposite movable contact 40 is a stationary contact portion 50 mounted on base 34. A lead connects contact portion 50 to a second switch terminal 52.

For operation of the bender switch, appropriate magnitudes provided by variable DC voltage source 12 and variable resistor 16 are selected. Specifically, the time-dependent velocity of the movable contact may be expressed as:

$$v(t) = \frac{p^*D_{max}^*\omega^2}{\omega^2 + p - 2\alpha p}\left[e^{-\alpha t}\left(\frac{(p-\alpha)}{\beta}\sin(\beta t) - \cos(\beta t)\right) + e^{-\beta t}\right] \quad (1)$$

where:
$\Omega$ = natural angular frequency of the bender,
p = 1/(R*C), where R is resistance of resistor 16 and C is capacitance of the first piezoelectric layer,
$\alpha$ = the damping coefficient of the system,
t = the time interval required for the movable contact to reach the stationary contact,
$D_{max}$ = the maximum unblocked displacement of the bender switch with maximum charging voltage from voltage source 12, and $$\beta = \sqrt{\Omega^2 - \alpha^2}.$$

Further, $$D_{max} = \gamma^*L^{2*}V_o, \quad (2)$$

where:
$\gamma$ = is a measured "deflection constant" for the beam,
L = the length of the beam, and
Vo = is the voltage output by voltage source 12.

The conditions which cause the velocity of the movable contact to be zero at the moment of closure, i.e. contact impact, are expressed as follows:

$$\alpha = p, \quad (3)$$

$$\Omega^*t = 2^*N^*pi/(1-(p/\Omega)^2)^{\frac{1}{2}}, \quad (4)$$

$$gap/D_{max} = 1 - e^{(-\alpha^*t)}, \quad (5)$$

where:
N = an integer corresponding to one of several period instants at which the the instantaneous velocity is momentarily zero, and
gap = fully open gap length between the contacts.

The length of the gap generally is predetermined to conform with operator specifications for a particular application.

Based upon the above-stated conditions, the following expressions are utilized in the preferred embodiment to determine voltage and resistance for source 12 and resistor 16 respectively:

$$\alpha = p = 1/(R^*C), \quad (6)$$

$$\Omega^*t = 2^*N^*pi/(1-(p/\Omega)^2)^{\frac{1}{2}}, \quad (7)$$

$$gap/D_{max} = 1 - e^{(-\alpha^*t)}, \text{ and} \quad (8)$$

$$D_{max} = \gamma^*L^{2*}V_o. \quad (9)$$

The symbolic representations in equations (6)–(9) correspond with those previously stated with respect to equations (1)–(5).

For the particular piezoelectric bender switch being used, the values of deflection constant $\gamma$, damping coefficient $\alpha$, natural angular frequency $\Omega$ and capacitance C should be known. These are inherent and measurable properties of the bender switch. These properties could be determined by utilizing mathematical models or by actual measurement. Specifically, deflection constant $\gamma$ can be measured by using an eddy current measuring device. The probe of the eddy current device is placed adjacent the movable end of the beam and a known magnitude of voltage is applied to the bender switch. The eddy current device then measures and records the displacement of the movable end. The deflection constant can then be determined from the recorded data in a well-known manner.

The damping coefficient and the natural angular frequency of the bender are determined by connecting the grounded input lead of an oscilloscope (not shown) to foil 22 and the other input lead of the oscilloscope to layer 28. An operator then "plucks", i.e. deflects and releases, the movable end of the beam causing the beam oscillate. The oscillation of the movable end causes piezoelectric layer 24 to generate a natural voltage, and the oscilloscope records this voltage. This measurement is possible because piezoelectric material generates a voltage when mechanically displaced from its equilibrium position. From this information, the damping coefficient and the natural angular frequency of the switch can be determined in a well-known manner.

Capacitance C can be determined by connecting the grounded input lead from a voltage measuring device (not shown) to foil 22 and the other input lead of the voltage measuring device to layer 28. A known voltage is then applied through a known resistance (not shown) to the switch across foil 22 and layer 28. The time required for the voltage reading of the measuring device to equal a particular fraction of the known voltage from the source is recorded, and from this information, capacitance C can be determined in a well-known manner. Generally, the fraction of the known voltage is selected to equally approximately 36.8% of the known voltage. This percentage is substantially equal to $1/e$ where "e" is the base of the natural logarithm. Therefore, the time required for the measured voltage to reach 36.8% of the known voltage is equal to time constant (p), i.e., $1/(R*C)$.

With $\alpha$ and C determined, equation (6) can be used to determine the value of resistance R. Next, knowing $w$, equation (7) is used to calculate closing interval t for various integer values of N. there is some freedom of choice in the value of N and generally, the fastest closure is obtained with $N=1$ and a slower closure is obtained with $N>1$. The maximum value of N for a particular bender is determined by the natural angular frequency, the gap length, the resistance of resistor 16, and the capacitance of piezoelectric layer 24. In practice, N typically will vary from one to nine.

The actual value of N will, in part, be determined subsequently by equation (8), wherein the resulting value of time t determines the ratio of gap/$D_{max}$. Generally, the gap/$D_{max}$ raatio should have a value of between 0.3 and 0.6. Since the gap length is usually specified in the original design, equation (8) can be utilized to determine a value for maximum displacement $D_{max}$ once time t has been specified. Supply voltage $V_o$ is calculated from equation (9), for which $\gamma$ and L are measured properties of the beam being used.

In operation, and after appropriate values for voltage source 12 and resistor 16 have been selected as hereinabove described, switch 14 is normally open and no charge is applied to bender switch 20. When switch 14 is closed by the operator-controlled unit the predetermined magnitude of charging voltage is applied between metal layer 28 and foil 22. Then piezoelectric layer 24, in response to the charging voltage, undergoes a dimensional change. This change causes the beam to warp, i.e. bend, and oscillate.

Before closure, the beam will oscillate N times. Further, the charging voltage being applied from control system 10 ensures that the movable contact has a low velocity at impact; that the phase of oscillation of the movable contact at closure tends to press the contacts together after closure; and that at contact closure the charging voltage is only a fraction of its maximum value. These conditions result in minimal contact bounce, thereby minimizing arcing that may occur between contact portions 44 and 50. The present activation system and method therefore also minimize the erosion of the contact surfaces and thereby increase the reliability and the life of the switch. When switch 14 opens, the charging voltage is removed from layer 24 and the beam returns to the neutral position shown in FIGS. 1 and 2.

Extended use of the piezoelectric bender switch may cause a gradual erosion of contact portions 44 and 50.

Since the control system may be easily adjusted in accordance with the present invention when the switch is new, it can also be re-adjusted from time-to-time. Specifically, erosion of contact portion 44 reduces its mass which causes an increase in the natural frequency of the bender switch. Further, the fully open gap length is increased, and the time required for movable contact 40 to impact upon stationary contact portion 50 is increased.

In oder to compensate for contact erosion, an erosion rate can be determined by operating a sample bender switch for a number of operations, such as 500,000 operations, and data can be gathered therefrom. The erosion rate can then be utilized to properly adjust the gap length, voltage source 12 and resistor 16 over a period time.

The adverse effects of contact erosion can be further minimized by utilizing a contact geometry which provides minimal fractional mass change and minimal gap change during contact erosion. To achieve these results, the preferred contact geometry construction as shown in FIG. 2 is used. The fixed contact has a flat contact portion 50 with a large diameter, and rounded movable contact portion 44 has a small end mass and a large radius of curvature.

It is also contemplated that rather than using a voltage source, a constant current charging source could be substituted. A charging current $I_{CH}$ would be output by the control system, and the magnitude of the charging current can then be determined in accordance with the following equations:

$$\text{gap} = (\gamma*L^2*I_{CH}/C)*t*e^{(-\alpha*t)}, \tag{10}$$

$$v(t) = (\gamma*L^2*I_{CH}/C)*[1-e^{(-\alpha*t)}], \text{ and} \tag{11}$$

$$\Omega*t = 2*N*pi/(1-(p/\Omega)^2)^{\frac{1}{2}}. \tag{12}$$

The symbols in equations (10)–(12) correspond to like symbols used in equations (1)–(9). With the constant current source, equations (10)–(12) are utilized to determine the optimized gap to minimize contact bounce. Generally, it is preferred to have the charging current, $I_{CH}$, as small possible to produces a minimum velocity at contact impact, therefore minimizing contact bounce. Equations (10)–(12) thus can be used to select parameters that ensure minimal contact bounce when a constant current source is employed.

While the present invention has been described with respect to specific embodiments, many modifications, variations, substitutions, and equivalents will now be apparent to those skilled in the art. For example, the control system can be mounted directly to the piezoelectric bender switch. The control system also could be utilized to control the switch to bend in more than one direction.

Numerous further modifications, changes, variations, substitutions and equivalents will now occur to those skilled in the art without departing from the spirit and scope of the present invention. Accordingly, the invention is to be considered as limited only by the spirit and scope of the appended claims.

What is claimed is:

1. A method of selecting an optimum resistance (R) for a resistor and an optimum voltage output (Vo) for a voltage source, said resistor and said voltage source being connected in series for activating a piezoelectric bender switch, said bender switch including a beam having at least one layer of piezoelectric ceramic mounted at one end to a support and being free to move at the opposite end, said switch further including a contact mounted adjacent the free end of said beam and a stationary contact opposite and spaced from said movable contact to define a gap therebetween, said method comprising the steps of:

determining the damping coefficient and the natural angular frequency of said beam;
  determining the deflection constant of said beam;
  determining the capacitance of said layer of piezoelectric ceramic;
  determining the fully open gap length between said movable and stationary contact;
  selecting said resistance (R) to substantially equal:

$$\frac{1}{(\alpha * C)}$$

where:
  $\alpha$ = said damping coefficient of said beam, and
  C = said capacitance of said first layer of piezoelectric ceramic;
  selecting a ratio between a time interval (t) for contact impact to occur and an integer (N) corresponding to a selected period at which the instantaneous velocity of movable contact will be zero to substantially equal:

$$2*pi/(\Omega*(1-(p/\Omega)^2)^{\frac{1}{2}})$$

where:
  $p = 1/(R*C) = \alpha$
  $\Omega$ = said natural angular frequency of said bender switch;
  selecting a ratio of gap/$D_{max}$ to substantially equal:

$$[1 - e^{(-\alpha * t)}]$$

where:
  gap = said fully open gap length between said contacts,
  $D_{max}$ = a maximum unblocked displacement of said movable contact when voltage (Vo) is applied to said beam; and
  selecting said voltage output (Vo) to substantially equal:

$$(D_{max})/[\gamma * L^2].$$

where:
  $\gamma$ = said deflection constant, and
  L = the length of said beam.

2. A method of selecting an optimum resistance (R) and an optimum voltage output (Vo) in accordance with claim 1 wherein the step of determining the damping coefficient and the natural angular frequency comprises:

oscillating the movable end of said bender switch; and
  measuring the voltage generated across said piezoelectric layer as said switch oscillates.

3. A method of selecting an optimum resistance (R) and an optimum voltage output (Vo) in accordance with claim 1 wherein the step of determining the deflection constant of said bender switch comprises:

applying a voltage of known magnitude across said layer of piezoelectric ceramic; and
  measuring the displacement of the movable end of said bender switch.

4. A method for selecting an optimum resistance (R) and an optimum voltage output (Vo) in accordance with claim 1 wherein the step of determining the capacitance of said layer of piezoelectric ceramic comprises:

applying a known voltage through a known resistance to said layer of piezoelectric ceramic; and
  measuring the time interval required to charge said layer of piezoelectric ceramic to a voltage level substantially equal to 36.8% of said known voltage.

5. A method for selecting an optimum resistance (R) and an optimum voltage output (Vo) in accordance with claim 1 wherein said integer (N), corresponding to one of several period instants at which the instantaneous velocity of said bender switch is zero, is within a range of one to nine.

6. A method for selecting an optimum resistance (R) and an optimum voltage (Vo) in accordance with claim 1 wherein the ratio between said fully open gap length and said maximum unblocked displacement of said movable contact is within a range of 0.3 and 0.6.

7. A method of selecting operating parameters for a piezoelectric bender switch operable from a constant current source connected in series with said piezoelectric bender switch, said bender switch including a beam having at least one layer of piezoelectric ceramic mounted at one end to a support and being free to move at the opposite end, said switch further including a contact mounted adjacent the free end of said beam and stationary contact opposite and spaced from said movable contact to define a gap therebetween, the length of said gap being predetermined, said method comprising the steps of:

determining the damping coefficient and the natural angular frequency of said beam;
  determining the deflection constant of said beam;
  determining the capacitance of said layer of piezoelectric ceramic;
  selecting a ratio between a time interval (t) for contact impact to occur and an integer (N) corresponding to a selected period at which the instantaneous velocity of the movable contact will be zero to substantially equal:

$$2*pi/(\Omega^2 - \alpha^2)^{\frac{1}{2}}$$

where:
  $\Omega$ = said natural angular frequency of said bender; and
  $\alpha$ = said damping coefficient of said beam;
  selecting a value of said integer N such that said time interval (t) provides that said gap has the predetermined length where said gap length equals:

$$(\gamma * L^2 * I_{CH}/C) * t * e^{-\alpha t}$$

where:
  $\gamma$ = said deflection constant
  L = the length of said beam, and
  C = said capacitance of said first layer of piezoelectric ceramic.

8. A method of selecting an optimized gap for a piezoelectric bender switch operable from a constant current source in accordance with claim 7 wherein the step of determining the damping coefficient and natural angular frequency comprises oscillating the movable end of said bender switch; and measuring the voltage generated across said piezoelectric layer as said switch oscillates.

9. A method of selecting an optimized gap for a piezoelectric bender switch operable from a constant current source in accordance with claim 7 wherein the step of determining the deflection constant of said bender switch comprises:

applying a voltage of known magnitude across said layer of piezoelectric ceramic; and measuring the displacement of the movable end of said bender switch.

10. A method of selecting an optimized gap for a piezoelectric bender switch operable from a constant current source in accordance with claim 7 wherein the step of determining the capacitance of said layer of piezoelectric ceramic comprises:

applying a known voltage through a known resistance to said layer of piezoelectric ceramic; and measuring the time interval required to charge said layer of piezoelectric ceramic to a voltage level equal to said known voltage.

11. A method of selecting an optimized gap for a piezoelectric bender switch operable from a constant current source in accordance with claim 7 wherein said integer (N), corresponding to one of several period instants at which the instantaneous velocity of said bender switch is zero, is within a range of one to nine.

12. A control system for controlling activation of a piezoelectric bender switch coupled thereto, said bender switch including a beam having at least one layer of piezoelectric ceramic mounted at one end to a support and being free to move at the opposite end, said switch further including a contact mounted adjacent the free end of said beam and a stationary contact opposite and spaced from said movable contact, said control system comprising:

a voltage source having a voltage output (Vo), said voltage output (Vo) being substantially equal to:

$$(D_{max})/[\gamma * L^2].$$

where:

$D_{max}$ = said maximum unblocked displacement of said movable contact, $\gamma$ = said measured deflection constant, and $L$ = the length of said beam; and a resistor connected in series with said voltage source and having a resistance (R) being substantially equal to:

$$\frac{1}{(\alpha * C)}$$

where:

$\alpha$ = the damping coefficient of said beam, and $C$ = the capacitance of said first layer of piezoelectric ceramic.

13. A control system in accordance with claim 12 further comprising a switch connected between and in series with said voltage source and said resistor, and wherein said switch is operator controlled to selectively control commutation thereof.

* * * * *